United States Patent [19]

Kuwahara

[11] 4,408,132
[45] Oct. 4, 1983

[54] HYSTERESIS CIRCUIT

[75] Inventor: Hisao Kuwahara, Kamakura, Japan

[73] Assignee: Tokyo Shibaura Denki Kabushiki Kaisha, Kawasaki, Japan

[21] Appl. No.: 299,227

[22] Filed: Sep. 3, 1981

[30] Foreign Application Priority Data

Sep. 10, 1980 [JP] Japan ................. 55-125755

[51] Int. Cl.³ .................. H03K 3/295; H03K 5/153
[52] U.S. Cl. .................. 307/359; 307/290; 307/299 B
[58] Field of Search ............ 307/290, 299 B, 359, 307/362, 350

[56] References Cited

U.S. PATENT DOCUMENTS 3,628,059  6/1970  Niu .................. 307/362
3,700,921 10/1972  Gay .
4,013,898  3/1977  Makino ............. 307/299 B
4,259,601  3/1981  Stein .

Primary Examiner—John Zazworsky
Attorney, Agent, or Firm—Cushman, Darby & Cushman

[57] ABSTRACT

First and second transistors which form a differential amplifier have their common emitter connected to a first constant current source and their collectors connected through a current mirror circuit to a power supply. The base potential of the first transistor depends on the current from the input signal source which may vary and which is supplied to the base of the first transistor. The base potential of the second transistor is determined by two resistors and a bias voltage source of a potential difference detecting circuit and by a second constant current source, said resistors, bias voltage source (VBY) and second constant current source being connected to the base of the second transistor. The differential amplifier is therefore turned on or off by the voltage level which is determined by the difference between the base potentials of the first and second transistors, i.e., the current ratio between the first and second constant current sources. Even with gradual increase of the variable current from the input signal source, an "off" state is maintained while the voltage $\Delta VBE$ is $\Delta VBE > 0$, but is changed to an "on" state when a predetermined current value is reached at which $\Delta VBE < 0$. Since a third transistor for current control and a fourth transistor for positive feedback are coupled to the second transistor, the working current thereof is suddenly increased at this time to a constant value which is held steady. This working current is supplied through a fifth transistor for output derivation to a load circuit. With gradual decrease of the variable current of the input signal source in this "on" state, this state is maintained while $\Delta VBE$ is $\Delta VBE < 0$, but is changed to the "off" state when a predetermined current is reached which is lower than the aforementioned predetermined current and at which $\Delta VBE$ becomes $\Delta VBE > 0$. At this time, the working current is suddenly reduced to zero due to the positive feedback action of the fourth transistor. Thus, it is possible to supply an output current which has a hysteresis characteristic to the load circuit.

4 Claims, 2 Drawing Figures

F I G. 1
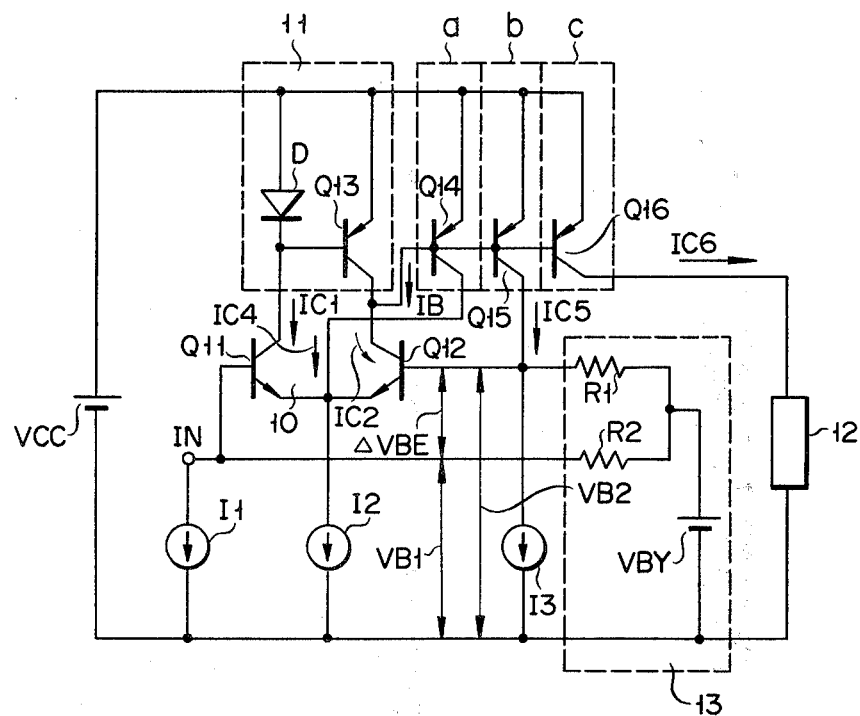
F I G. 2
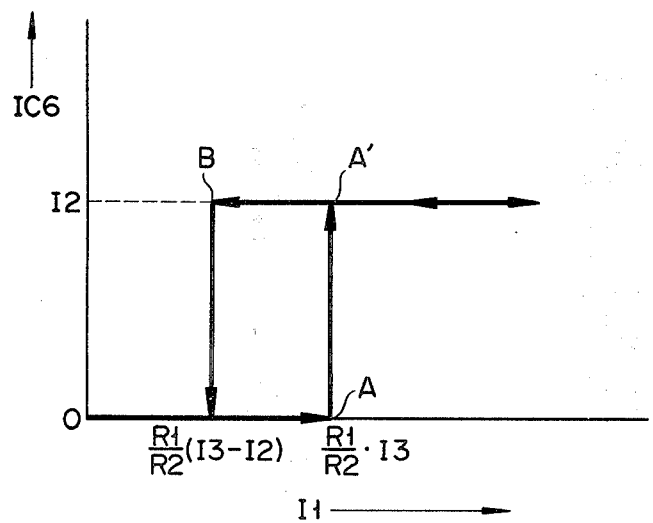

HYSTERESIS CIRCUIT

BACKGROUND OF THE INVENTION

This invention relates to hysteresis circuits and, more particularly, to hysteresis circuits which are free from source voltage fluctuations.

FM stereo tuners generally include a stereo indicator circuit for indicating the stereo reception state and a commonly termed FM muting circuit for muting noise between channel and channel when tuning. These circuits are varieties of the level discrimination (switching) circuit and are realized by Schmitt trigger circuits having hysteresis characteristics.

As is well known in the art, such a Schmitt circuit includes a first and a second transistor with their emitters commonly connected. These transistors are connected together with their collector resistors and common emitter resistor between a power supply and a reference potential point.

Therefore, the hysteresis voltage of this circuit, which is determined by an "on" level of the input voltage that is required for turning on the first transistor and turning off the second transistor and an "off" level of the input voltage required for turning off the first transistor and turning on the second transistor, is directly influenced by the source voltage fluctuations.

This means that the hysteresis characteristic of the circuit is adversely affected by the source voltage fluctuations and is also considerably influenced by drift.

Where a Schmitt trigger circuit which is subject to the aforementioned various influences is used as a level discrimination (switching) circuit in the stereo indicator circuit or FM muting circuit mentioned above, therefore, malfunction is inevitable, which is a grave drawback.

U.S. Pat. No. 4,259,601 and No. 3,700,921 disclose hysteresis circuits. These hysteresis circuits, however, also have similar drawbacks as in the Schmitt trigger circuit since their hysteresis characteristics have dependency upon the source voltage fluctuations.

SUMMARY OF THE INVENTION

An object of the invention is to provide a hysteresis circuit, which is free from the influence of the source voltage fluctuations and drift.

Another object of the invention is to provide a hysteresis circuit, which is free from the influence of the source voltage fluctuations and drift and can also readily be made free from the temperature dependency.

A further object of the invention is to provide a hysteresis circuit, which is free from the influence of the source voltage fluctuations and drift and is capable of altering the "on" and "off" levels without altering the hysteresis values.

A still further object of the invention is to provide a hysteresis circuit, which is suited for implementation with an integrated circuit.

The hysteresis circuit according to the invention includes a first and a second transistor constituting a differential amplifier. These first and second transistors have their emitters commonly connected to a first constant current source. The base of the first transistor is connected to an input signal source. The base of the second transistor is connected to a second constant current source and also connected through a resistor to a bias source. The second transistor has its collector and emitter respectively connected to the base and collector of a third transistor serving as a current limiting transistor. The second transistor further has its collector and base respectively connected to the base and collector of a fourth transistor which is provided for positive feedback. The collector of the second transistor is further connected to the base of a fifth transistor, which serves as an output derivation transistor and has its collector connected to a load circuit.

With the construction described above, the hysteresis characteristic is determined only by the current ratio (difference) of the first and second constant current sources. Thus, influence of the fluctuations of source voltage (inclusive of the bias source voltage) can be eliminated. In addition, the influence of drift can also be eliminated because the construction is a differential amplifier.

BRIEF DESCRIPTION OF THE DRAWINGS

FIG. 1 is a circuit diagram showing an embodiment of the hysteresis circuit according to the invention; and FIG. 2 is a graph showing the hysteresis characteristic of the hysteresis circuit of FIG. 1.

DETAILED DESCRIPTION OF THE PREFERRED EMBODIMENT

Referring now to FIG. 1, an input terminal IN is connected to the negative terminal side of a variable current source I1 which serves as an input signal source and the base of a first transistor Q11, which is part of a differential amplifier 10. The differential amplifier 10 also includes a second transistor Q12. The first and second transistors Q11 and Q12 have their emitters commonly connected to one end of a first constant current source I2. The collector of the first transistor Q11 is connected to the cathode of a diode D in a current mirror circuit 11, and the collector of the second transistor Q12 is connected to the collector of a transistor Q13 in the current mirror circuit. In the current circuit 11, the base and emitter of the transistor Q13 are respectively connected to the cathode and anode of the diode D, and the juncture between the anode of the diode and emitter of the transistor is connected to the positive terminal side of a power supply VCC.

The collector of the second transistor Q12 is connected to the common base of third, fourth and fifth transistors Q14, Q15 and Q16, which are of the opposite conductivity type to the first and second transistors Q11 and Q12 and respectively constitute a current limiting circuit a, a positive feedback circuit b and an output derivation circuit c. The collectors of the third, fourth and fifth transistors Q14, Q15 and Q16 are respectively connected to one end of a first constant current source I2, to one end of a second constant current source I3 and to one end of a load circuit 12. The aforementioned one end of the second constant current source I3 is also connected to the base of the second transistor Q12.

A potential difference detecting circuit 13 which also serves as a bias circuit includes a bias power supply VBY, the positive terminal side of which is connected through resistors R2 and R1 to the base of the first and second transistors Q11 and Q12 of the differential amplifier 10.

The positive terminal side of the power supply VCC is connected directly or through resistance if necessary to the emitter of the third, fourth and fifth transistors Q14, Q15 and Q16, and the negative terminal of the power supply VCC, which serves as a reference potential point, is commonly connected to the other end of the current sources I1, I2 and I3, to the negative terminal side of the bias power supply VBY and to the other terminal of the load circuit 12.

In the hysteresis circuit of the above construction, the current amplification factor hfe of each of the transistors Q11 and Q16 is sufficiently high, that is, the base current into each transistor is ignorable with respect to the collector current thereof. The transistor Q13 in the current mirror circuit 11 normally carries current.

In the differential amplifier 10, the base voltage VB1 on the first transistor Q11 is decreased as the current of the variable current source I1 is increased from zero. Now, the case when the base voltage VB1 on the first transistor Q11 is higher than the base voltage VB2 on the second transistor Q12, that is, when the voltage between base and base $\Delta VBE$ is $VB1-VB2>0$, will be considered. In this case, the collector currents IC1 and IC2 in the first and second transistors Q11 and Q12 of the differential amplifier 10 are $$IC1 > IC2. \quad (1)$$

The latter collector current IC2 at this time is equal to the collector current IC3 in the transistor Q13 in the saturated state in the current mirror 11.

Thus, the base current IB to the third, fourth and fifth transistors Q14, Q15 and Q16 which have the common base is $$IB = IC2 - IC3 = 0. \quad (2)$$

Hence, the third, fourth and fifth transistors Q14, Q15 and Q16 are all "off," and the collector currents IC4, IC5 and IC6 are all zero. Consequently, there is no output current from the load circuit 12.

Denoting the base voltage VB2 on the second transistor Q12 in this state by $[VB2]_{OFF}$, $$[VB2]_{OFF} = VBY - I3 \cdot R1. \quad (3)$$

Now, the case when the current of the variable current source I1 is increased to such an extent that the base voltage VB1 on the first transistor Q11 becomes lower than the base voltage VB2 on the second transistor Q12, i.e., $\Delta VBE$ becomes $\Delta VBE < 0$, will be considered. The current $[I1]_{ON}$ at this time becomes $$[I1]_{ON} > (R1/R2) \cdot I3. \quad (4)$$

As a result, the relation between the collector currents IC1 and IC2 in the first and second transistors Q11 and Q12 becomes $$IC1 < IC2. \quad (5)$$

At this time, the collector current IC3 flowing from the collector of the transistor Q13 in the current mirror circuit 11 is equal to the collector current IC1 in the first transistor Q11.

Thus, the common base current into the transistors Q14, Q15 and Q16 becomes
$$IB = IC2 - IC3 > 0. \quad (6)$$

As a result, the third, fourth and fifth transistors Q14, Q15 and Q16 are turned on to cause the collector currents IC4, IC5 and IC6. At this time, a positive feedback circuit is formed between the second and fourth transistors Q12 and Q15, and the collector currents IC4, IC5 and IC6 in the third, fourth and fifth transistors Q14, Q15 and Q16 are suddenly increased. However, since the collector of the third transistor Q14 is connected to the common emitter of the first and second transistors Q11 and Q12, the operation of the positive feedback circuit is stopped when the collector current IC4 becomes equal to the current of the first constant current source I2. Since the collector currents IC4, IC5 and IC6 of the third, fourth and fifth transistors Q14, Q15 and Q16 are $IC4 = IC5 = IC6$, the collector current IC6, i.e., the output current, becomes equal to the current of the first constant current source I2.

FIG. 2 shows the relation between the currents IC6 and I1. When the current of the current source I1 (given by formula (4)) is increased up to the point A, the collector current IC6 which has been zero goes to a value equal to the current of the first constant current source I2 and appears as the output circuit current. This output circuit current IC6 remains the same even with subsequent increase of the current of the variable current source I1.

Denoting the base voltage on the second transistor Q12 when the third, fourth and fifth transistors Q14, Q15 and Q16 are turned on by $[VB2]_{ON}$, $$[VB2]_{ON} = VBY - (I3 - I2)R1. \quad (7)$$

Now, what happens with gradual decrease of the current of the variable current source I1 will be described. When the current of the variable current source I1 is reduced to a point A' in FIG. 2 (which is given by the formula (4)), the third, fourth and fifth transistors Q14, Q15 and Q16 remain "on" since the base voltage VB1 on the first transistor Q11 (i.e., $VBY - I1 \cdot R2$) at this time is lower than the value given by the formula (7).

When the current of the variable current source I1 is further reduced to an extent that the base voltage VB1 on the first transistor Q11 becomes lower than the value of the formula (7), (i.e., when $\Delta VBE$ becomes $\Delta VBE > 0$), the relation of the formula (1) for the collector currents IC1 and IC2 of the first and second transistors Q11 and Q12 is recovered. As the latter collector current IC2 becomes equal to the collector current IC3 of the transistor Q13 in the saturated state in the current mirror 11, the value of the common base current IB into the third, fourth and fifth transistors Q14, Q15 and Q16 as given by the formula (2) is recovered. That is, the third, fourth and fifth transistors Q14, Q15 and Q16 are all turned off to render the collector currents IC4, IC5 and IC6 all zero. Denoting the current of the variable current source I1 in this state by $[I1]_{OFF}$, $$[I1]_{OFF} < (R1/R2)(I3 - I2). \quad (8)$$

In FIG. 2, this is shown by a sudden change of the output circuit current IC6 to zero at a point B.

The base voltage VB2 on the second transistor Q12 in this state is set to the value given by the formula (3).

Thus, the hysteresis current $I_H$ is given, from the formulas (4) and (8), as $$I_H = \frac{[I1]_{OFF}}{[I1]_{ON}} = \frac{I3 - I2}{I3}. \quad (9)$$

As is apparent from the formula (9), the hysteresis current is free from the influence of the voltage fluctuations of the power supply VCC. Also, the effect of drift is very slight, for the hysteresis circuit constitutes a differential amplifier. Further, the temperature dependency can be precluded by making such correction that the relative values of the first and second constant current sources I2 and I3 and first and second resistors R1 and R2 are constant irrespective of the ambient temperature. Thus, the invention is sufficiently effective when applied to a switching circuit having a slight hysteresis characteristic such as an FM muting circuit, and is also applicable to all circuits for which more or less hysteresis characteristics are required, for instance a waveform shaping circuit in a digital circuit. Particularly, since the hysteresis characteristic can be determined by the resistance ratio (R1/R2) and current ratio ((I3−I2)/I3), variation of the "on" and "off" levels can be obtained without altering the hysteresis characteristic, for instance through the control of the resistance ratio. This is desirous from the standpoint of implementation with an integrated circuit. Particularly, in monolithic, bipolar and like integrated circuits, the current drive system is preferred to the voltage drive system.

While in the above embodiment of FIG. 1 the first and second transistors Q11 and Q12 have been NPN transistors, the same effects can also be obtained with PNP transistors. Further, it is possible to construct the current mirror circuit 11 and third to fifth transistors Q14 to Q16 as a multi-collector transistor circuit. Doing so permits the reduction of the number of component elements and also saving of space. Various other changes and modifications of the above embodiment are also possible without departing from the scope and spirit of the invention.

As has been described in detail, according to the invention it is possible to provide a very excellent hysteresis circuit, which has a hysteresis characteristic free from the influence of source voltage fluctuations and drift and also free from temperature dependency and is capable of alteration of the "on" and "off" levels without changing the hysteresis values and also implementation with an integrated circuit.

What is claimed is:

1. A hysteresis circuit comprising first and second transistors constituting a differential amplifier, a first constant current source connected between the common emitter of said first and second transistors and a reference potential point, an input signal source connected to the base of said first transistor, a second constant current source connected between the base of said second transistor and said reference potential point, a bias voltage source connected through a first resistor to the base of said second transistor, and third, fourth and fifth transistors of the opposite conductivity type to said first and second transistors and each having the emitter connected to one end of a power supply and the base connected to the collector of said second transistor, said third transistor having the collector connected to the emitter of said second transistor, said fourth transistor having the collector connected to the base of said second transistor, said fifth transistor having the collector connected to a load circuit.

2. The hysteresis circuit according to claim 1, wherein the collector of said first and second transistors is connected through a current mirror circuit to said one end of power supply.

3. The hysteresis circuit according to claim 1, wherein the base of said first transistor is connected through a second resistor to the juncture between said first resistor and bias voltage source.

4. The hysteresis circuit according to claim 1, wherein said third, fourth and fifth transistors are constituted by a multi-collector transistor.

* * * * *